United States Patent
Yamamoto

(10) Patent No.: US 12,389,539 B2
(45) Date of Patent: Aug. 12, 2025

(54) WIRING BOARD AND MODULE

(71) Applicant: Murata Manufacturing Co., Ltd., Kyoto (JP)

(72) Inventor: Issei Yamamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 203 days.

(21) Appl. No.: 18/459,949

(22) Filed: Sep. 1, 2023

(65) Prior Publication Data

US 2023/0413439 A1 Dec. 21, 2023

Related U.S. Application Data

(63) Continuation of application No. PCT/JP2022/004869, filed on Feb. 8, 2022.

(30) Foreign Application Priority Data

Apr. 2, 2021 (JP) ................. 2021-063641

(51) Int. Cl.
*H05K 1/14* (2006.01)
*H05K 1/02* (2006.01)
*H05K 1/18* (2006.01)
*H05K 3/28* (2006.01)
*H05K 3/46* (2006.01)

(52) U.S. Cl.
CPC .............. *H05K 1/14* (2013.01); *H05K 1/028* (2013.01); *H05K 1/0296* (2013.01); *H05K 1/181* (2013.01); *H05K 1/183* (2013.01); *H05K 1/189* (2013.01); *H05K 3/284* (2013.01); *H05K 3/4611* (2013.01); *H05K 2201/041* (2013.01)

(58) Field of Classification Search
CPC ........ H05K 1/14; H05K 1/189; H05K 3/4611; H05K 3/4688; H05K 3/4691; H05K 3/4697; H05K 2203/061
See application file for complete search history.

(56) References Cited

U.S. PATENT DOCUMENTS

| 2005/0168961 A1* | 8/2005 | Ono .................. H01L 25/0652 257/E25.011 |
| 2008/0047737 A1* | 2/2008 | Sahara .................. H05K 1/186 29/830 |
| 2008/0079829 A1 | 4/2008 | Choi et al. |
| 2008/0295326 A1 | 12/2008 | Tuominen et al. |

(Continued)

FOREIGN PATENT DOCUMENTS

| JP | 2005-251889 A | 9/2005 |
| JP | 2007-324521 A | 12/2007 |
| JP | 2008-509549 A | 3/2008 |

(Continued)

OTHER PUBLICATIONS

International Search Report for PCT/JP2022/004869 dated Apr. 26, 2022.

*Primary Examiner* — Nathan Milakovich
(74) *Attorney, Agent, or Firm* — McDonald Hopkins LLC

(57) ABSTRACT

Wiring board includes rigid board and flexible board laminated on rigid board. Cavity recessed in thickness direction of rigid board is formed in surface of rigid board which is located on flexible board side. Side surface and bottom surface of cavity are formed of rigid board. Top surface of cavity is formed of flexible board.

20 Claims, 12 Drawing Sheets

(56) References Cited

U.S. PATENT DOCUMENTS

| | | | | |
|---|---|---|---|---|
| 2014/0054079 A1* | 2/2014 | Shen | ................... | H05K 3/4611 |
| | | | | 174/262 |
| 2014/0070900 A1* | 3/2014 | Kitano | .................. | B81B 7/0041 |
| | | | | 361/679.01 |

FOREIGN PATENT DOCUMENTS

| JP | 2011155199 A | * | 8/2011 |
|---|---|---|---|
| JP | 5168838 B2 | | 3/2013 |
| JP | 2020-088121 A | | 6/2020 |

* cited by examiner

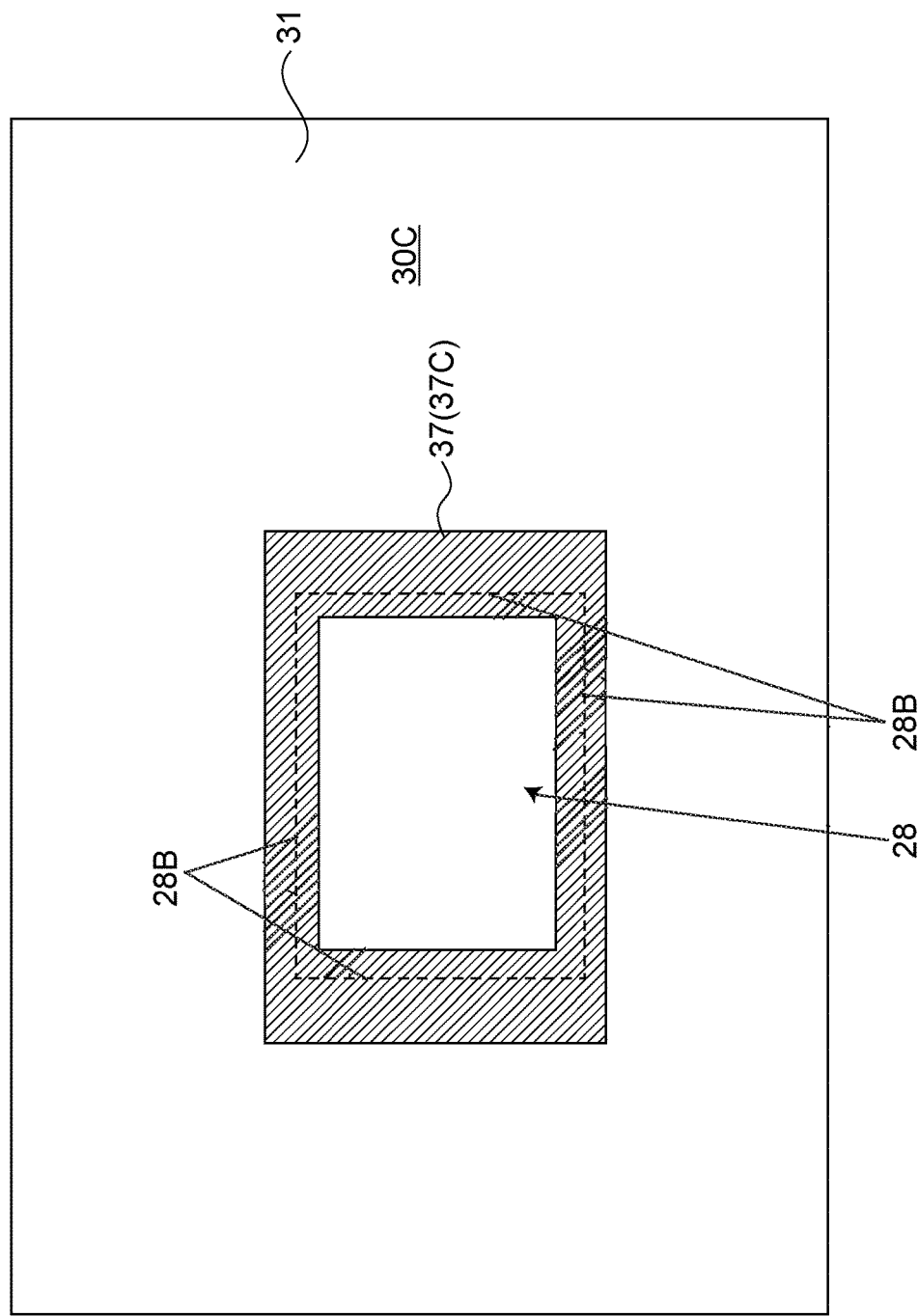

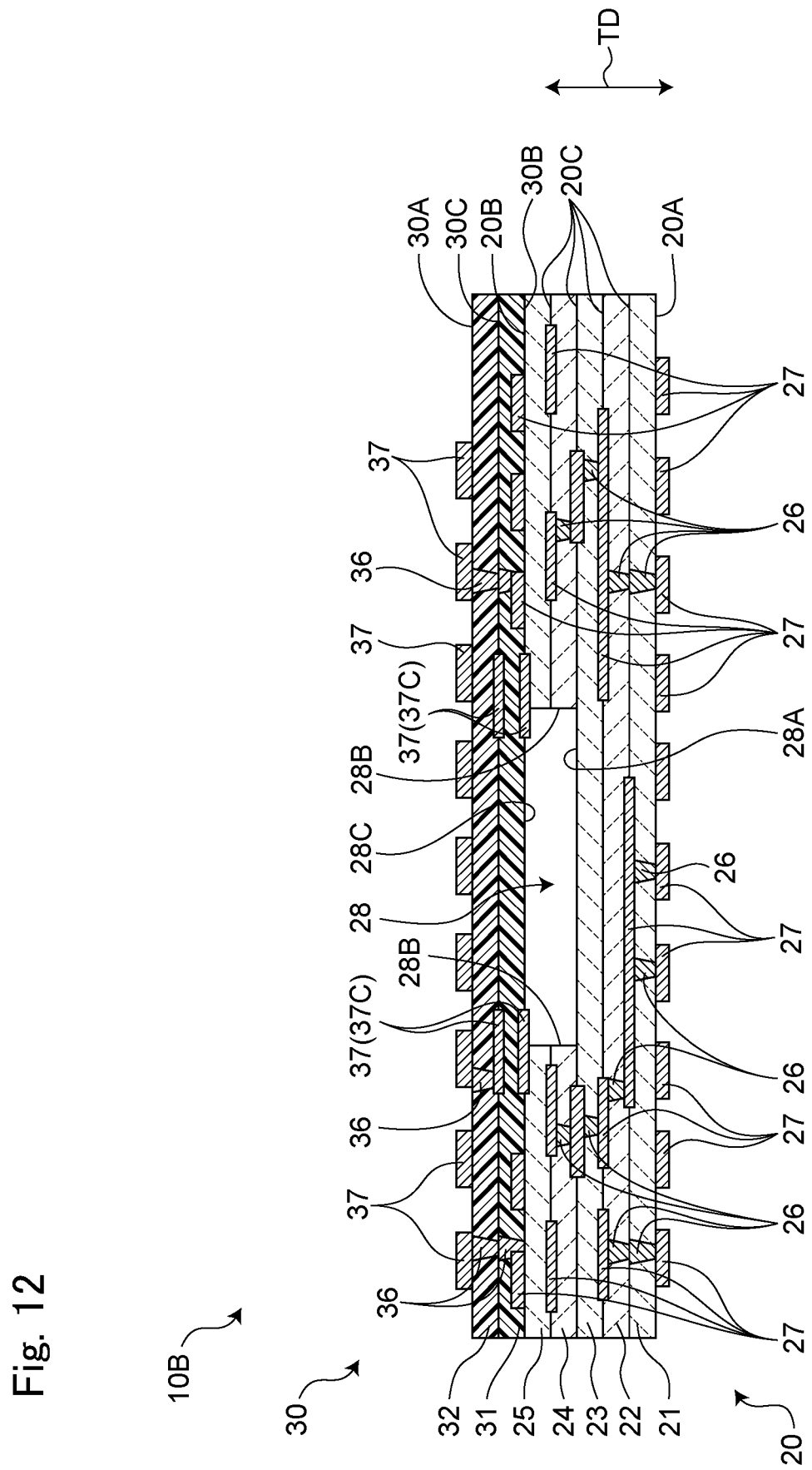

WIRING BOARD AND MODULE

CROSS REFERENCE TO RELATED APPLICATION

This is a continuation of International Application No. PCT/JP2022/004869 filed on Feb. 8, 2022 which claims priority from Japanese Patent Application No. 2021-063641 filed on Apr. 2, 2021. The contents of these applications are incorporated herein by reference in their entireties.

BACKGROUND OF THE DISCLOSURE

Field of the Disclosure

The present disclosure relates to a wiring board including a base material and electrodes formed on the base material.

Description of the Related Art

As a wiring board including a base material and electrodes formed on the base material, for example, Patent Document 1 discloses a multilayer board, and Patent Document 2 discloses a multilayer printed wiring board.

In the multilayer board of Patent Document 1, a resin layer is formed between adjacent ceramic sheets. In the multilayer printed wiring board of Patent Document 2, an insulating layer obtained by curing a prepreg is formed between a rigid wiring board and a flexible wiring board which are adjacent to each other. That is, the wiring boards of Patent Documents 1 and 2 each have a material such as a resin applied between adjacent boards.

Patent Document 1: JP 2020-88121 A
Patent Document 1: JP 5168838 B2

BRIEF SUMMARY OF THE DISCLOSURE

When a material such as a resin is applied between adjacent boards as in the wiring boards of Patent Documents 1 and 2, there is a possibility that capacitive coupling occurs between a circuit formed on one of the adjacent boards and a circuit formed on the other of the adjacent boards. As a countermeasure against this, it is conceivable to provide a cavity between adjacent boards without applying a material such as a resin. In this case, the cavity between adjacent boards is filled with air. The relative permittivity of air is smaller than the relative permittivity of a material such as a resin. Therefore, the occurrence of capacitive coupling as described above can be suppressed.

However, when the space between the adjacent boards is a cavity, there is no material such as a resin for supporting the boards. Therefore, when pressure acts on the board from the outside, a crack may occur in the board. When the pressure is large, the board may be cracked.

In addition, in a case where the space between the adjacent boards is a cavity, the volume variation of the cavity due to a temperature change is larger than that in a case where the space between the adjacent boards is made of a material such as a resin. In this case, even if the space between the adjacent boards is a cavity, there is a possibility that capacitive coupling occurs although the volume between the adjacent boards is smaller than that in a case where the space between the adjacent boards is made of a material such as a resin. In this case, the capacitance varies due to the volume variation of the cavity, and the characteristics of the circuits formed on adjacent boards may vary.

In addition, the above-described crack may occur in the board due to the volume variation of the cavity.

Therefore, a possible benefit of the present disclosure is to solve the above problems and to provide a wiring board capable of suppressing the occurrence of cracks in a board facing a cavity and volume variation of the cavity while including the cavity therein.

In order to achieve the above possible benefit, the present disclosure is configured as follows. A wiring board according to one aspect of the present disclosure includes a rigid board and a flexible board laminated on the rigid board. A cavity recessed in the thickness direction of the rigid board is formed in a surface of the rigid board which is located on the flexible board side, a side surface and a bottom surface of the cavity are formed of the rigid board, and the top surface of the cavity is formed of the flexible board.

According to the present disclosure, it is possible to suppress the occurrence of cracks in the board facing the cavity and the volume variation of the cavity while providing the cavity therein.

BRIEF DESCRIPTION OF THE SEVERAL VIEWS OF THE DRAWINGS

FIG. 11 is a transverse sectional view corresponding to the C-C cross section of a modification of a wiring board provided with a module according to the fourth embodiment of the present disclosure in FIG. 9; and FIG. 12 is a longitudinal sectional view corresponding to the A-A cross section of a modification of the wiring board provided with the module according to the fourth embodiment of the present disclosure in FIG. 1.

DETAILED DESCRIPTION OF THE DISCLOSURE

Figure 1:
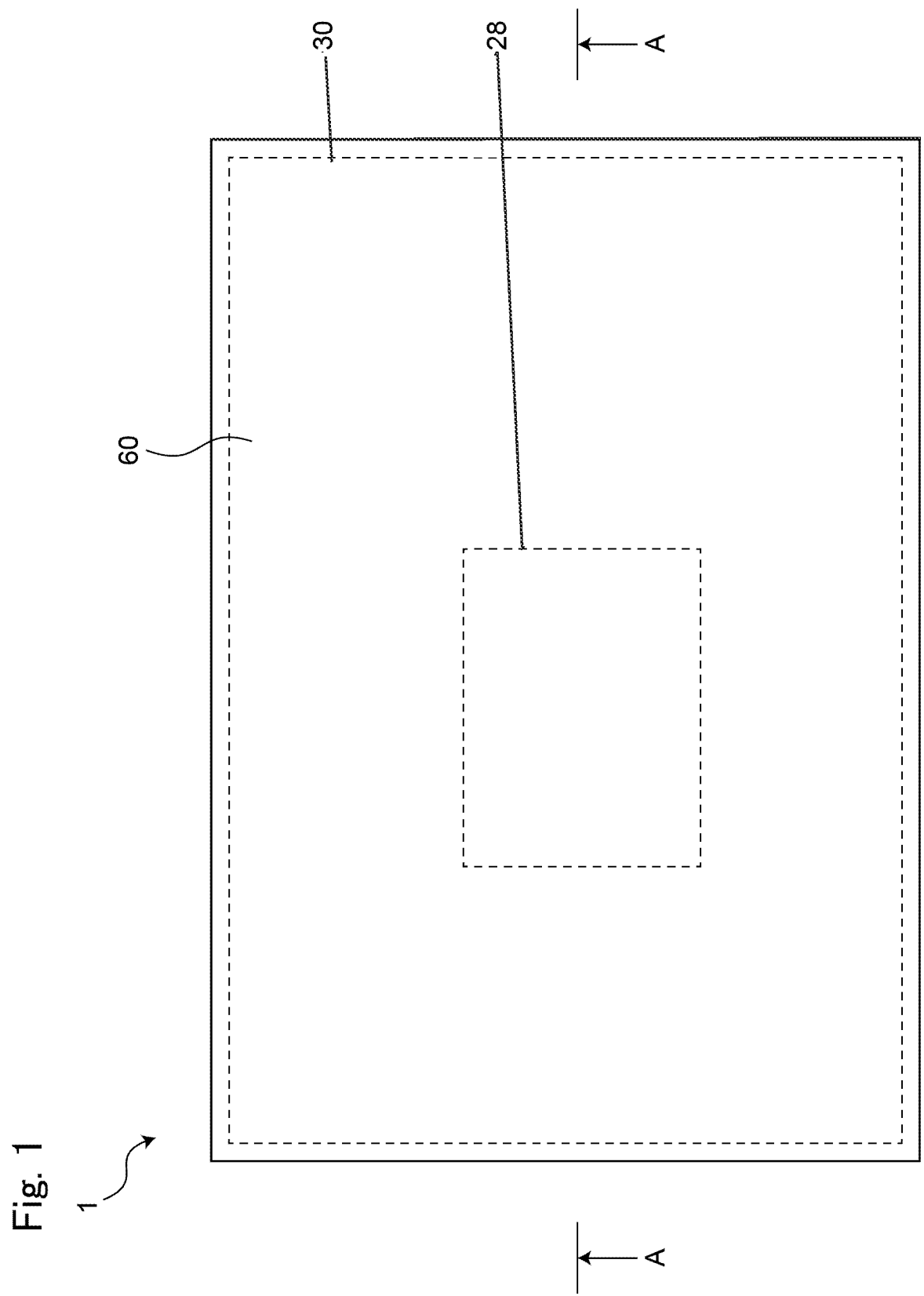
FIG. 1 is a plan view of a module according to a first embodiment of the present disclosure.

A wiring board according to one aspect of the present disclosure includes a rigid board and a flexible board laminated on the rigid board. A cavity recessed in the thickness direction of the rigid board is formed in a surface of the rigid board which is located on the flexible board side, a side surface and a bottom surface of the cavity are formed of the rigid board, and the top surface of the cavity is formed of the flexible board.

If the top surface of the cavity is a rigid board having low flexibility, the rigid board may be cracked. According to this configuration, since the top surface of the cavity is a flexible board having high flexibility, the occurrence of cracks can be suppressed.

According to this configuration, the bottom surface and the side surface of the cavity are the rigid board having high rigidity. Therefore, the volume variation of the cavity can be suppressed by the configuration in which at least one of the bottom surface and the side surface of the cavity is a flexible board having low rigidity. In particular, since the side surface of the cavity is the rigid board, the volume variation of the cavity in the thickness direction of the rigid board can be suppressed.

The wiring board according to one aspect of the present disclosure may further include a protruding member disposed in the cavity and protruding from the bottom surface of the cavity toward the flexible board.

According to this configuration, the protruding member comes into contact with the flexible board from the bottom surface side of the cavity, whereby the deflection of the flexible board can be suppressed. As a result, the volume variation of the cavity can be suppressed.

In the wiring board, the rigid board may include a first base material and a first electrode formed on the first base material, and the protruding member may be made of the same material as the first base material or the first electrode.

According to this configuration, when the protruding member and the bottom surface of the cavity are bonded to each other, adhesiveness can be enhanced by using the same material. In addition, since the types of materials to be used can be reduced, it is possible to suppress an increase in the cost of the wiring board due to the use of members of various types of materials.

In the wiring board, the protruding member may be in contact with a top surface of the cavity.

According to this configuration, the deflection of the flexible board can be suppressed as compared with the configuration in which the protruding member is separated from the top surface of the cavity.

In the wiring board, the flexible board may include a second base material and a second electrode formed on the second base material, and the second electrode may form at least a part of the top surface of the cavity. The protruding member may be in contact with the second electrode forming the top surface of the cavity.

Usually, the rigidity of the electrode formed on the flexible board is higher than the rigidity of the base material of the flexible board. According to this configuration, since the second electrode having higher rigidity than the second board comes into contact with the protruding member, the deflection of the flexible board can be suppressed as compared with the configuration in which the second board comes into contact with the protruding member.

In the wiring board, the protruding member may be located in a central portion of the cavity as viewed in the thickness direction of the rigid board.

According to this configuration, it is possible to suppress the deflection of the flexible board as compared with the configuration in which the protruding member is positioned near the outer edge portion of the cavity as viewed in the thickness direction of the rigid board.

In the wiring board, the flexible board may include a second base material and a second electrode formed on the second base material, and at least a part of the protruding member may overlap at least a part of the second electrode when viewed from the thickness direction of the rigid board.

According to this configuration, it is possible to suppress the deflection of the flexible board as compared with the configuration in which the protruding member is at a position shifted from the second electrode when viewed from the thickness direction of the rigid board.

In the wiring board, the flexible board may include a second base material and a second electrode formed on the second base material, and the protruding member may be at a position shifted from the second electrode when viewed from the thickness direction of the rigid board.

According to this configuration, as compared with the configuration in which at least a part of the protruding member overlaps at least a part of the second electrode when viewed from the thickness direction of the rigid board, it is possible to suppress capacitive coupling between the circuit formed on the rigid board and the circuit formed on the flexible board.

In the wiring board, the flexible board may include a second base material and a second electrode formed on the second base material, and the second electrode may straddle at least a part of an outer edge portion of the cavity when viewed from the thickness direction of the rigid board.

According to this configuration, the deflection of the flexible board can be suppressed as compared with the configuration in which the second electrode does not straddle the outer edge portion of the cavity.

In the wiring board, the second electrode straddling the outer edge portion of the cavity may be formed on a surface of the second base material which is located on the rigid board side.

When the first electrode is formed on the surface of the first base material of the rigid board which is located on the flexible board side, a step is generated between a portion of the surfaced on which the first electrode is formed and a portion of the surface on which the first electrode is not formed. When the flexible board is laminated on the rigid board, the flexible board may be deflected due to the generation of the step at the outer edge of the cavity. According to this configuration, the second electrode straddling the outer edge of the cavity is formed on the surface of the second base material which is located on the rigid board side. This makes it possible to reduce the step at the outer edge of the cavity. As a result, the deflection of the flexible board as described above can be suppressed.

In the wiring board, the rigid board may include a first base material and a first electrode formed on the first base material, and the flexible board may include a second base material and a second electrode formed on the second base material. The Young's modulus of the first base material may be 10 times or more the Young's modulus of the second base material.

According to this configuration, the first base material is less likely to be distorted than in a configuration in which the Young's modulus of the first base material is less than 10 times the Young's modulus of the second base material. Therefore, according to this configuration, as compared with the configuration in which the Young's modulus of the first base material is less than 10 times the Young's modulus of the second base material, the volume variation of the cavity based on the distortion of the first base material can be suppressed.

According to this configuration, the flexibility of the second base material is higher than that in the configuration in which the Young's modulus of the second base material is larger than 1/10 of the Young's modulus of the first base material. Therefore, according to this configuration, the occurrence of cracks in the second base material can be suppressed as compared with the configuration in which the Young's modulus of the second base material is larger than 1/10 of the Young's modulus of the first base material.

A module according to an aspect of the present disclosure includes the wiring board and an electronic component that is mounted on at least one of the rigid board and the flexible board and constitutes at least a part of a transmission/reception circuit. At least a part of the electronic component overlaps at least a part of the cavity when viewed from the thickness direction of the rigid board.

According to this configuration, capacitive coupling can be suppressed by the cavity. Therefore, it is possible to reduce the influence of capacitive coupling on transmission/reception signals for electronic components constituting at least a part of the transmission/reception circuit. The electronic components constituting at least a part of the transmission/reception circuit are, for example, a power amplifier (PA), a low noise amplifier (LNA), and a switch (SW).

In the module, electronic components constituting at least a part of the transmission/reception circuit may include a first transmission/reception component mounted on the rigid board and a second transmission/reception component mounted on the flexible board. At least a part of the first transmission/reception component may overlap at least a part of the cavity when viewed from the thickness direction of the rigid board. At least a part of the second transmission/reception component may overlap at least a part of the cavity when viewed from the thickness direction of the rigid board.

According to this configuration, capacitive coupling can be suppressed by the cavity. Therefore, it is possible to reduce the influence of capacitive coupling on transmission/reception signals for the first transmission/reception component and the second transmission/reception component.

A module according to an aspect of the present disclosure includes the wiring board having the protruding member and an electronic board mounted on the rigid board. The protruding member is the electronic component.

According to this configuration, the protruding member can have the function of an electronic component in addition to a function of suppressing deflection of the flexible board. This makes it possible to reduce the number of electronic components mounted on the outer surfaces of the rigid board and the flexible board.

First Embodiment

Figure 2:
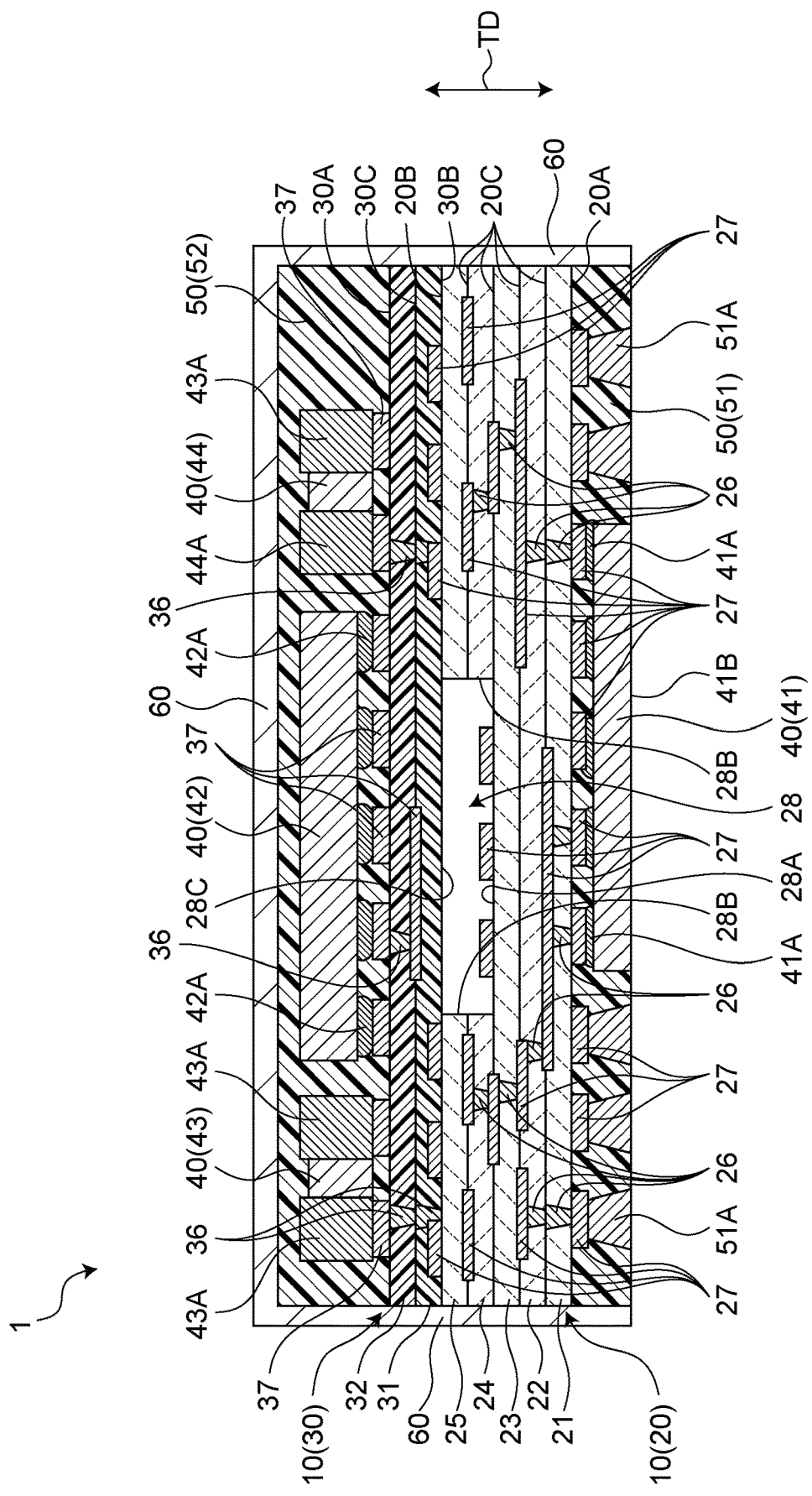
FIG. 2 is a longitudinal sectional view showing the A-A cross section of FIG. 1.

FIG. 1 is a plan view of a module according to the first embodiment of the present disclosure. FIG. 2 is a longitudinal sectional view illustrating the A-A cross section in FIG. 1. The module includes a wiring board and electronic components. The wiring board is formed by laminating a flexible board on a rigid board. Various electronic components can be mounted on the wiring board.

As illustrated in FIGS. 1 and 2, a module 1 includes a wiring board 10 having a rigid board 20 and a flexible board 30, an electronic component 40, a sealing resin 50, and a shield film 60. Note that illustration of the electronic component 40, the sealing resin 50, and the shield film 60 is omitted in FIGS. 5, 6, and 8 to 13 described later.

The module 1 has a rectangular parallelepiped shape as a whole. The shape of the module 1 is not limited to a rectangular parallelepiped shape.

As illustrated in FIG. 2, the rigid board 20 includes five boards 21, 22, 23, 24, and 25, a via conductor 26, and an electrode 27.

The board 21 to 25 are made of, for example, a resin such as glass epoxy, Teflon (registered trademark), or paper phenol, or a ceramic such as alumina or low temperature co-fired ceramics (LTCC). The boards 21 to 25 each are an example of a first base material. In the first embodiment, the rigid board 20 is formed by laminating the boards 21 to 25. That is, in the first embodiment, the rigid board 20 is a six-layer board. The number of boards constituting the rigid board 20 is not limited to five. For example, the number of boards constituting the rigid board 20 may be one. In this case, the rigid board is a single-sided board or a double-sided board.

The via conductor 26 is formed on each of the boards 21 to 25 of the rigid board Referring to FIG. 2, the via conductor 26 is formed in the board 21 to 24. The via conductor 26 may be formed on the board 25 or may not be formed on the boards 21 to 24. In the case of a resin board, the via conductor 26 is formed by plating a through hole (via) vertically penetrating each of the board 21 to 25 with a conductive metal made of copper or the like. In the case of a ceramic board, the through hole is filled with a conductive paste and co-fired with a ceramic. The conductive paste is made of, for example, copper.

The electrode 27 is formed on the rigid board 20. The electrode 27 is an example of the first electrode. The electronic component 40 is mounted on a part of the plurality of electrodes 27. The other part of the plurality of electrodes 27 functions as wiring. The electrodes 27 are formed on one main surface 20A of the rigid board 20, the other main surface 20B of the rigid board 20, and an inner surface 20C sandwiched between two adjacent boards of the boards 21 to 25. The electrode 27 may not be formed on the one main surface 20A. Similarly, the electrode 27 may not be formed on the other main surface 20B and may not be formed on the inner surface 20C.

The electronic component 40 is mounted on a part of the plurality of electrodes 27 formed on one main surface 20A of the rigid board 20. The other part of the electrode 27 formed on the one main surface 20A of the rigid board 20 is a terminal electrode. When the module 1 is mounted on another board or the like (not illustrated), the terminal electrode and an electrode formed on the other board or the like are electrically connected via a via conductor 51A described later.

When the rigid board 20 is a ceramic board, the electrode 27 is formed by printing a conductive paste on a pad formed on each surface (one main surface 20A, the other main surface 20B, and the inner surface 20C) of the rigid board 20 and co-firing the paste with the ceramic board. The conductive paste is made of, for example, copper. When the rigid board 20 is a resin board, the electrodes 27 are formed on the pads on the respective surfaces of the rigid board 20 by known means such as etching a metal foil.

Each of the electrodes 27 is electrically connected to the other electrode 27 via the via conductor 26 or the like. At least a part of the electrode 27 formed on the other main surface 20B of the rigid board 20 is electrically connected to the via conductor 36 formed on the flexible board 30.

As illustrated in FIG. 2, the flexible board 30 includes two boards 31 and 32, the via conductor 36, and an electrode 37.

The boards 31 and 32 have higher flexibility than the board 21 to 25 of the rigid board 20. In the first embodiment, the Young's modulus of the boards 21 to 25 of the rigid board 20 is 10 times or more the Young's modulus of the boards 31 and 32. The Young's modulus of polyimide or liquid crystal polymer (LCP) which is a material of the flexible board 30 is 3 to 5 (GPa), and the Young's modulus of LTCC which is a main material of the rigid board is 50 to 80 (GPa). The boards 31 and 32 are made of, for example, a polyimide-based resin. The boards 31 and 32 each are an example of the second base material. In the first embodiment, the flexible board 30 is configured by laminating boards 31 and 32. That is, in the first embodiment, the flexible board 30 is a three-layer board. Note that the number of boards constituting the flexible board 30 is not limited to two. For example, the number of boards constituting the flexible board 30 may be three. In this case, the flexible board 30 is a four-layer board.

The via conductor 36 is formed on each of the boards 31 and 32 of the flexible board 30. Referring to FIG. 2, the via conductors 36 are formed on both the boards 31 and 32. The via conductor 36 may be formed on only one of the boards 31 and 32 or may not be formed on any of the boards 31 and 32. The via conductor 36 is formed by plating a through hole (via) vertically penetrating each of the boards 31 and 32 with a conductive metal made of copper or the like.

The electrode 37 is formed on the flexible board 30. The electrode 37 is an example of the second electrode. The electronic components 40 are mounted on some of the plurality of electrodes 37. The remaining electrodes of the plurality of electrodes 37 function as wirings. The electrodes 37 are formed on one main surface 30A of the flexible board 30 and the inner surface 30C sandwiched between the boards 31 and 32. Note that the electrode 37 may be formed on the other main surface 30B of the flexible board 30 or may not be formed on the one main surface 30A and the inner surface 30C.

The flexible board 30 is laminated on the other main surface 20B of the rigid board 20. When the flexible board 30 is laminated on the rigid board 20, the other main surface 30B of the flexible board 30 faces and is in contact with the other main surface of the rigid board 20.

The electronic components 40 are mounted on the plurality of electrodes 37 formed on the one main surface 30A of the flexible board 30.

The electrode 27 is formed on a pad of each surface (one main surface 30A, the other main surface 30B, and the inner surface 30C) of the flexible board 30 by known means such as etching a metal foil.

Each of the electrodes 37 is electrically connected to the other electrode 37 via the via conductor 36 or the like. At least a part of the via conductor 36 formed on the board 31 is electrically connected to the electrode 27 formed on the other main surface of the rigid board 20. As a result, the electrode 37 of the flexible board 30 and the electrode 27 of the rigid board 20 are electrically connected via the via conductor 36.

A cavity 28 recessed in the thickness direction TD of the rigid board 20 is formed in the other main surface 20B of the rigid board 20, that is, in the surface of the rigid board 20 which is located on the flexible board 30 side. The cavity 28 is covered with the other main surface 30B of the flexible board 30.

As a result, a bottom surface 28A and a side surface 28B of the cavity 28 are formed of the rigid board 20, and a top surface 28C of the cavity 28 is formed of the flexible board 30. In the first embodiment, the bottom surface 28A of the cavity 28 is formed by a part of the inner surface 20C of the rigid board 20 which is located on the board 24 side of the board 23 and the electrode 27 formed on the inner surface 20C. The side surface 28B of the cavity 28 is formed by the side surfaces of the boards 24 and 25. The top surface 28C of the cavity 28 is formed by a part of the other main surface 30B of the board 31 of the flexible board 30.

The electronic components 40 are mounted on one main surface 20A of the rigid board 20 and one main surface 30A of the flexible board 30. In the first embodiment, the module 1 includes four electronic components 41 to 44 as the electronic components 40. Referring to FIG. 2, one electronic component 41 is mounted on one main surface 20A of the rigid board 20, and the three electronic components 42 to 44 are mounted on the flexible board 30. The number of electronic components 40 included in the module 1 is not limited to four. The number of electronic components 40 mounted on the rigid board is not limited to one, and the number of electronic components 40 mounted on the flexible board 30 is not limited to three.

In the first embodiment, the electronic components 41 and 42 constitute at least a part of a transmission/reception circuit. The transmission/reception circuit is a circuit that generates a high-frequency signal. The electronic component 41 is an example of a first transmission/reception component. The electronic component 42 is an example of a second transmission/reception component. The electronic components 41 and 42 are, for example, a power amplifier (PA), a low noise amplifier (LNA), a switch (SW), a SAW filter, a BAW filter, and the like.

The electronic components 41 and 42 include conductive members 41A and 42A, respectively. The conductive members 41A and 42A are, for example, a conductive adhesive containing copper, silver, or the like, solder, a melting point change type alloy, or the like. The electronic component 41 is electrically connected to the electrode 27 formed on the one main surface 20A of the rigid board 20 via the conductive member 41A. The electronic component 42 is electrically connected to the electrode 37 formed on the one main surface 30A of the flexible board 30 via the conductive member 42A. As a result, the electronic component 41 is mounted on one main surface 20A of the rigid board 20, and the electronic component 42 is mounted on one main surface 30A of the flexible board 30.

When viewed in the thickness direction TD of the rigid board 20, a part of the electronic component 41 overlaps a part of the cavity 28. When viewed in the thickness direction TD of the rigid board 20, a part of the electronic component 42 overlaps the entire cavity 28. The overlap between each of the electronic components 41 and 42 and the cavity 28 when viewed from the thickness direction TD of the rigid board 20 is not limited thereto. When viewed in the thickness direction TD of the rigid board 20, at least a part of the electronic component 41 may overlap at least a part of the cavity 28. Similarly, when viewed in the thickness direction TD of the rigid board 20, at least a part of the electronic component 42 may overlap at least a part of the cavity 28. Note that the electronic components 41 and 42 may not overlap with the cavity 28 as viewed in the thickness direction TD of the rigid board 20.

The electronic components 43 and 44 are, for example, resistors and capacitors that do not generate or hardly generate a high frequency signal. The electronic components 43 and 44 include conductive portions 43A and 44A, respectively. The electronic components 43 and 44 are electrically connected to the electrode 37 formed on the one main surface 30A of the flexible board 30 via the conductive portions 43A and 44A, respectively. As a result, the electronic components 43 and 44 are mounted on one main surface 30A of the flexible board 30.

When viewed in the thickness direction TD of the rigid board 20, the electronic components 43 and 44 do not overlap the cavity 28. However, the electronic components 43 and 44 may overlap the cavity 28 as viewed in the thickness direction TD of the rigid board 20.

The sealing resin 50 includes a sealing resin 51 provided on one main surface 20A of the rigid board 20 and a sealing resin 52 provided on one main surface 30A of the flexible board 30. The sealing resin 51 covers a part (specifically, the portion of the electronic component 41 excluding the surface 41B opposite to the surface facing the rigid board 20) of the electronic component 41. The sealing resin 52 covers the entire electronic component 42 to 44. The sealing resin 51 may cover the entire electronic component 41, and the sealing resin 52 may cover only a part of the electronic component 42 to 44.

The via conductor 51A is formed in the sealing resin 51. The via conductor 36 is formed by plating a through hole (via) vertically penetrating each of the sealing resin 51 with a conductive metal made of copper or the like. The via conductor 51A is electrically connected to the electrode 27 functioning as a terminal electrode at the end portion on the rigid board 20 side. An end portion of the via conductor 51A which is located on the side opposite to the rigid board 20 is exposed to the outside. When the module 1 is mounted on another board or the like (not illustrated), the end portion on the opposite side is electrically connected to an electrode formed on another board or the like.

The shield film 60 is provided so as to cover the rigid board 20, the flexible board and the sealing resin 50 from the sealing resin 52 side. In the first embodiment, the shield film 60 has a box shape opened to the sealing resin 51 side. The shield film 60 is made of a conductive member such as copper. The shield film 60 is grounded. For example, the shield film 60 is grounded by being connected to the ground of another board on which the module 1 is mounted. In this case, the potential of the shield film 60 is the ground potential.

If the top surface 28C of the cavity 28 is the boards 21 to 25 of the rigid board having low flexibility, the rigid board 20 may be cracked. According to the first embodiment, since the top surface 28C of the cavity 28 is the board 31 of the flexible board 30 having high flexibility, the generation of cracks can be suppressed.

According to the first embodiment, the bottom surface 28A and the side surface 28B of the cavity 28 are the boards 23 toe 25 of the rigid board 20 having high rigidity. Therefore, the volume variation of the cavity 28 can be suppressed by the configuration in which at least one of the bottom surface 28A and the side surface 28B of the cavity 28 is the boards 31 and 32 of the flexible board 30 having low rigidity. In particular, since the side surface 28B of the cavity 28 is the boards 24 and 25 of the rigid board 20, the volume variation of the cavity 28 in the thickness direction TD of the rigid board 20 can be suppressed.

According to the first embodiment, capacitive coupling can be suppressed by the cavity 28. Therefore, it is possible to reduce the influence of capacitive coupling on transmission/reception signals to the electronic components 41 and 42 which are transmission/reception components.

According to the first embodiment, the boards 21 to 25 is less likely to be distorted than in the configuration in which the Young's modulus of the boards 21 and 25 is less than 10 times the Young's modulus of the boards 31 and 32. Therefore, the first embodiment can suppress the volume variation of the cavity 28 based on the distortion of the boards 21 to 25 as compared with the configuration in which the Young's modulus of the board 21 to 25 is less than 10 times the Young's modulus of the boards 31 and 32.

According to the first embodiment, the flexibility of the boards 31 and 32 is higher than that in the configuration in which the Young's modulus of the boards 31 and 32 is larger than $\frac{1}{10}$ of the Young's modulus of the boards 21 to 25. Therefore, according to the first embodiment, the occurrence of cracks in the boards 31 and 32 can be suppressed as compared with the configuration in which the Young's modulus of the boards 31 and 32 is larger than $\frac{1}{10}$ of the Young's modulus of the boards 21 to 25.

Figure 3:
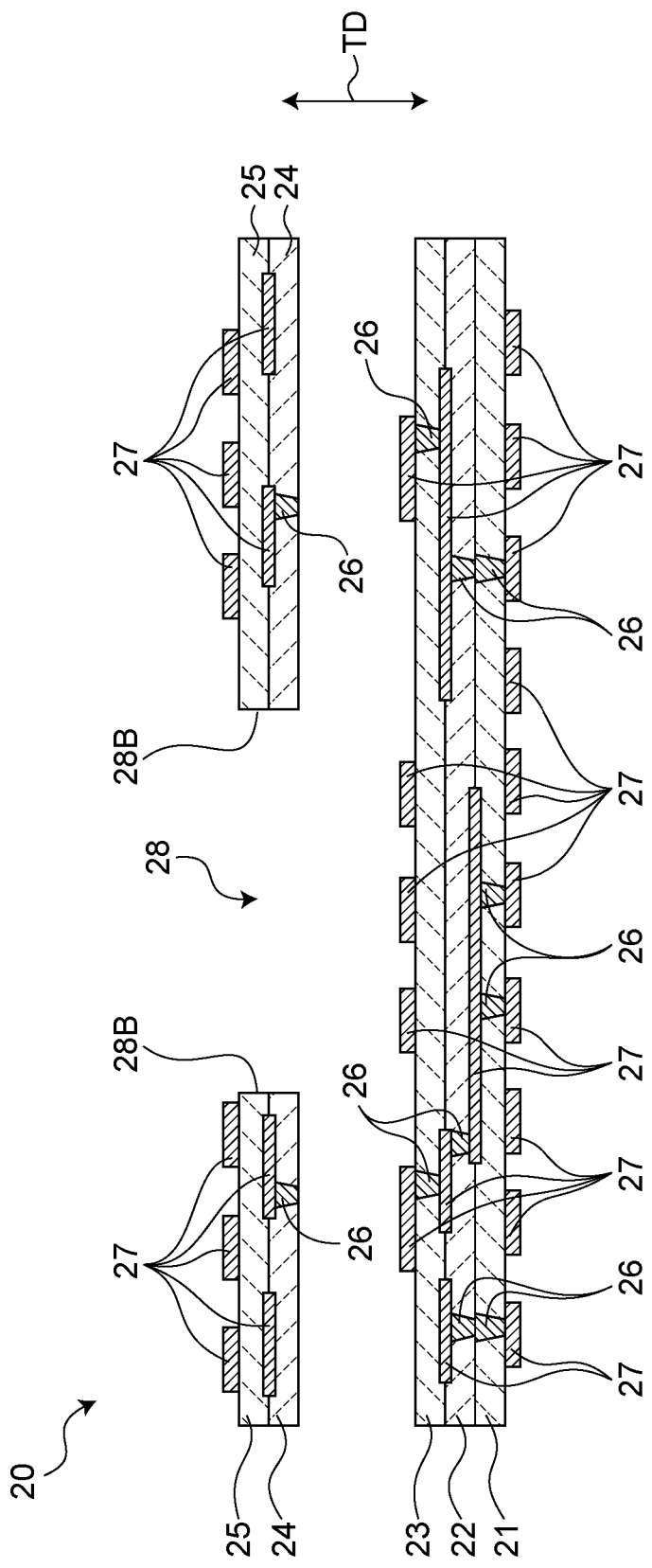
FIG. 3 is a longitudinal sectional view corresponding to the A-A cross section of a rigid board in FIG. 1.
Figure 4:
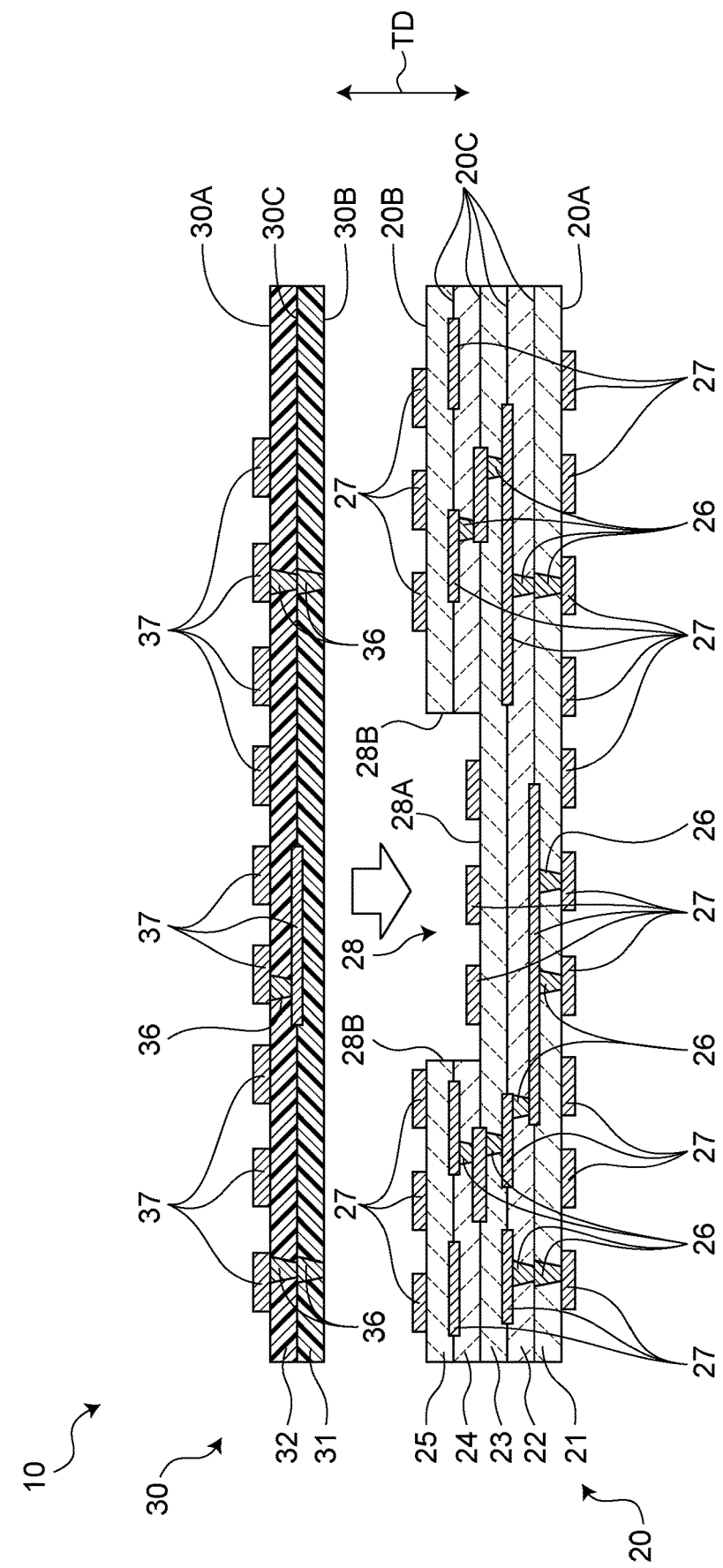
FIG. 4 is a longitudinal sectional view corresponding to the A-A cross section of the rigid board and a flexible board in FIG. 1.

Hereinafter, an example of a method for manufacturing the module 1 will be described. FIG. 3 is a longitudinal sectional view corresponding to the A-A cross section of the rigid board in FIG. 1. FIG. 4 is a longitudinal sectional view corresponding to the A-A cross section of the rigid board and the flexible board in FIG. 1.

The module 1 is formed by cutting a mother board on which the electronic component 40 is mounted into pieces and then forming the shield film 60. The mother board is formed by integrating a plurality of wiring boards 10 in an arranged state. The following description is a method for manufacturing each of the plurality of wiring boards 10 constituting the mother board and the module 1 configured by mounting the electronic component 40 on each of the wiring boards 10. In the following description, the rigid board 20 of the wiring board 10 is made of ceramic.

First, a rigid board preparing process is executed. Hereinafter, a process of processing an LTCC as the rigid board 20 will be described.

As shown in FIG. 3, in the rigid board preparing step, green sheets corresponding to the five boards 21 to 25 constituting the rigid board 20 are prepared by a known green sheet forming process. At this time, through holes are formed in the boards 24 and 25. These through holes correspond to the cavity 28. The through holes are formed by a mechanical punch, a laser, or the like. The depth of the cavity 28 is determined depending on in how many boards the through holes are formed. The depth of the cavity 28 is appropriately set to 10 to 90% of the thickness of the rigid board 20. For example, the depth of the cavity 28 is 30 to 300 μm.

In the rigid board preparing process, the via conductors 26 and the electrodes 27 are formed in green sheets by a known process. The green sheets are laminated on each other and fired.

Next, a flexible board preparing process is performed. The flexible board preparing step may be executed prior to the rigid board preparing step or may be performed in parallel with the rigid board preparing step.

As illustrated in FIG. 4, in the flexible preparing process, the two boards 31 and 32 constituting the flexible board 30 are prepared by a known molding process. As a material for the boards 31 and 32, a thermosetting resin, a thermoplastic resin, or a composite material of a thermosetting resin and a thermoplastic resin can be used. For example, a polyolefin-based resin, an epoxy-based resin, a polyimide-based resin, a bismaleimide-based resin, a polyphenylene ether-based resin, a polytetrafluoroethylene-based resin, or a liquid crystal polymer (LCP) can be used. When the boards 31 and 32 are prepared using a liquid crystal polymer, a coverlay can be used.

In the flexible board preparing process, the via conductors 36 and the electrodes 37 are formed on the boards 31 and 32 by a known process. The prepared boards 31 and 32 are laminated on each other.

Next, a flexible board laminating process is executed. By executing this process, the wiring board 10 including the rigid board 20 and the flexible board 30 is manufactured.

As illustrated in FIG. 4, the boards 31 and 32 (flexible board 30) prepared in the flexible board preparing step are laminated on the fired LTCC board (rigid board 20) prepared in the rigid board preparing step. The flexible board 30 is joined to the fired LTCC board by heating and pressurization. The flexible board 30 is laminated on the board 25. As a result, the opening of the cavity 28 is covered with the flexible board 30. The flexible board 30 is not in a liquid form but in a sheet form. Therefore, the cavity 28 is maintained without filling the inside of the cavity 28 with the flexible board 30.

The flexible board 30 may be laminated on the fired LTCC board by vacuum lamination. This makes it possible to prevent air from being mixed between the flexible board 30 and the fired LTCC board. In this case, it is desirable to form an air vent hole for making the cavity 28 communicate with the outside in the flexible board 30 or the fired LTCC board.

Next, a mounting step is executed. In the mounting step, the electronic components 40 (the electronic components 41 to 44) are mounted on the fired LTCC board and the flexible board 30. The mounting is performed by known means. After the mounting, a reflow process is executed. The fired LTCC board and the resin sheet may be cleaned with an organic cleaning liquid or the like after the reflow process.

Next, a coating step is executed. In the coating step, the fired LTCC board is coated with the sealing resin 51, and the flexible board 30 is coated with the sealing resin 52. Thus, the sealing resin 51 covers the electronic component 41. Thus, the sealing resin 52 covers the electronic components 42 to 44. In addition, in the coating step, the via conductor 51A is formed in the sealing resin 51 by a known process.

Next, a dicing step is executed. In the dicing step, the above-described dicing is executed. As a result, the electronic component 40 is mounted on each of the plurality of wiring boards 10 (one wiring board 10).

Next, a shield film forming process is executed. In the shield film forming step, a metal film is formed by sputtering, plating, or the like, for example, to form the shield film 60. The shield film 60 may be formed by applying a resin containing a conductive material as a filler. In addition, the shield film 60 may have a configuration in which a plurality of layers of a plurality of types of materials are laminated. By forming the shield film 60, the module 1 illustrated in FIG. 2 is completed.

The shape and size of the cavity 28 are not limited to the shape and size illustrated in FIG. 2. Referring to FIG. 2, the module 1 has one cavity 28 but may have a plurality of cavities 28. When the module 1 has a plurality of cavities 28, the shapes and sizes of the cavities 28 may be the same or different from each other. When the module 1 has the plurality of cavities 28, the depths of the cavities 28 may be the same or different from each other.

In the first embodiment, the side surface 28B of the cavity 28 is formed of the boards 24 and 25. However, what forms the side surface 28B of the cavity 28 varies depending on the depth of the cavity 28. For example, when the cavity 28 is recessed from the other main surface 20B of the rigid board 20 to the board 22, the side surface 28B of the cavity 28 is formed of the boards 22 to 25. In this case, the bottom surface 28A of the cavity 28 is formed by a part of the inner surface 20C of the board 21 which is located on the board 22 side.

In the first embodiment, the bottom surface 28A of the cavity 28 is formed by the inner surface 20C of the board 23 and the electrode 27. However, the bottom surface 28A of the cavity 28 may be formed only of the inner surface 20C of the board 23 or may be formed only of the electrode 27. That is, the bottom surface 28A of the cavity 28 is formed by at least the boards 21 to 25 or the electrode 27.

In the first embodiment, the top surface 28C of the cavity 28 is formed only by the other main surface 30B of the board 31 of the flexible board 30. However, the top surface 28C of the cavity 28 may be formed by the other main surface 30B of the board 31 and the electrode 37 formed on the other main surface 30B. In addition, the top surface 28C of the cavity 28 may be formed only of the electrode 37 formed on the other main surface 30B. That is, the top surface 28C of the cavity 28 is formed by at least one of the board 31 and the electrode 37.

In the first embodiment, the electronic components 40 (the electronic components 41 and 42) constituting at least a part of the transmission/reception circuit are mounted on both the rigid board 20 and the flexible board 30. However, the electronic component 40 constituting at least a part of the transmission/reception circuit may be mounted on only one of the rigid board 20 and the flexible board 30.

Second Embodiment

Figure 5:
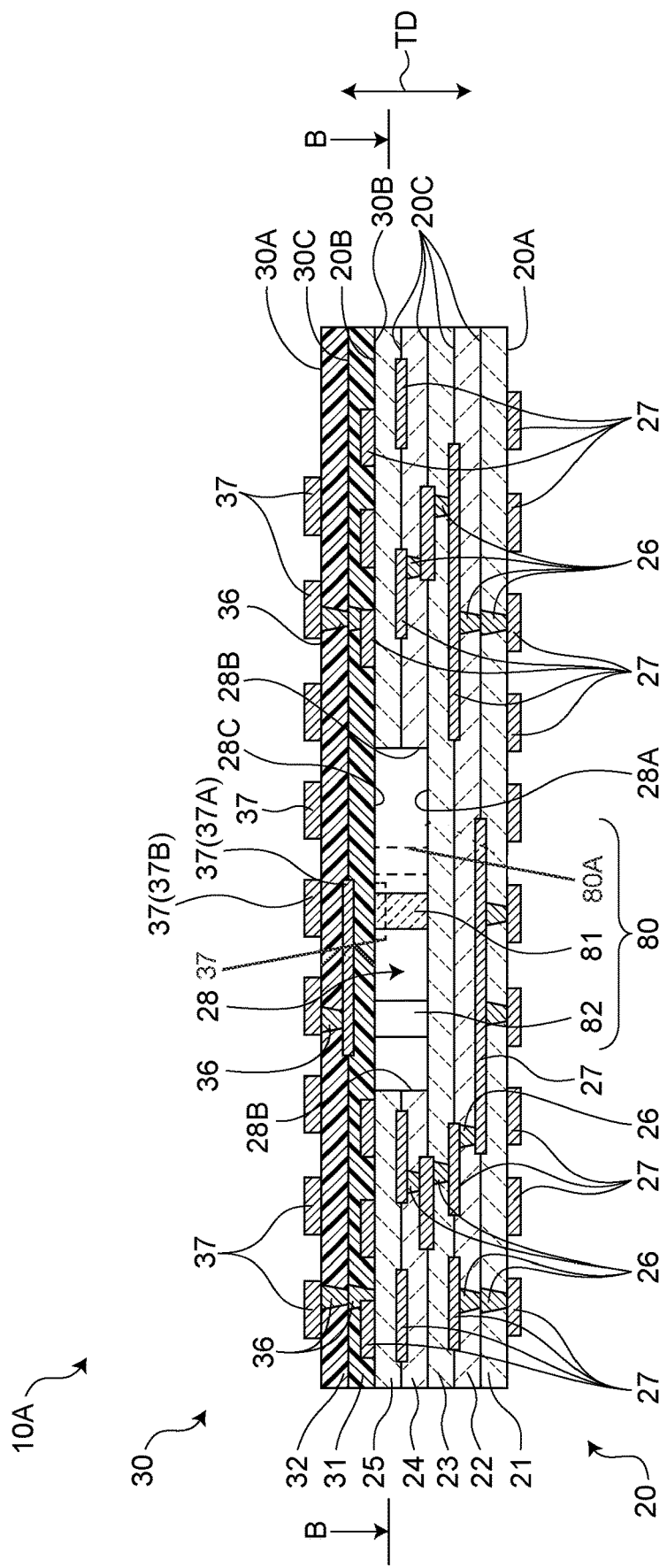
FIG. 5 is a longitudinal sectional view corresponding to the A-A cross section of a wiring board provided with a module according to a second embodiment of the present disclosure in FIG. 1.
Figure 6:
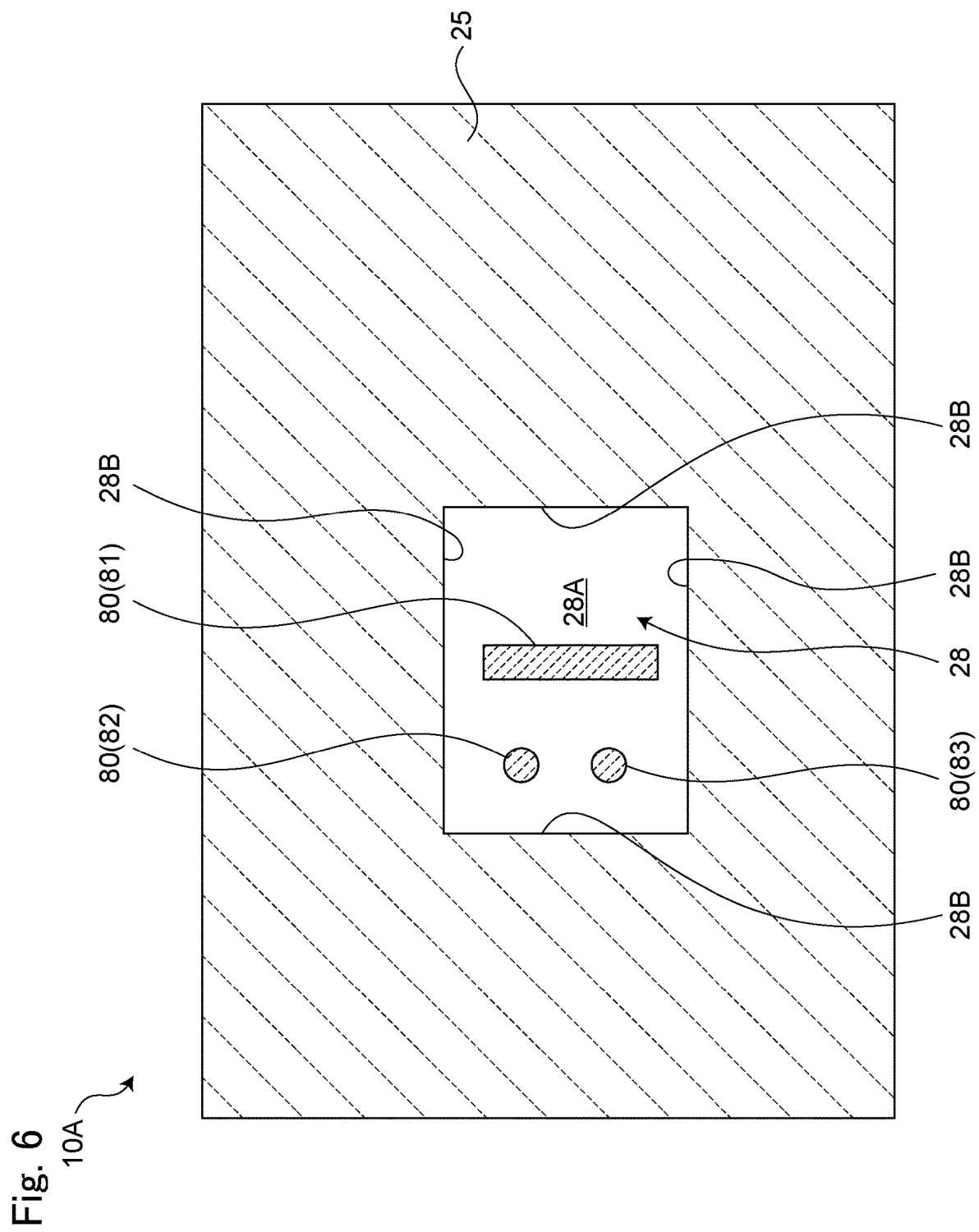
FIG. 6 is a transverse sectional view showing the B-B cross section in FIG. 5.

FIG. 5 is a longitudinal sectional view corresponding to the A-A cross section of a wiring board provided with a module according to the second embodiment of the present disclosure in FIG. 1. FIG. 6 is a transverse sectional view showing the B-B cross section in FIG. 5. A wiring board 10A included in the module according to the second embodiment is different from the wiring board 10 included in the module 1 according to the first embodiment in that a protruding member 80 is further included. Hereinafter, differences from the first embodiment will be described. Common points with the wiring board 10 according to the first embodiment are denoted by the same reference numerals, and a description thereof will be omitted in principle and described as necessary. The same applies to each embodiment described later.

As illustrated in FIGS. 5 and 6, the wiring board 10A includes the protruding member 80. In the second embodiment, the wiring board 10A includes one wall 81 and two pillars 82 and 83 as the protruding member 80.

In the second embodiment, the protruding member 80 is made of the same material as boards 21 to 25. That is, the protruding member 80 is made of, for example, a resin such as glass epoxy, Teflon (registered trademark), or paper phenol, ceramic such as alumina, or the like.

The protruding member 80 may be made of a material different from that of the board 21 to 25. For example, the protruding member 80 may be made of the same material (copper or the like) as an electrode 27. Further, for example, the protruding member 80 may be made of a material different from both the board 21 to 25 and the electrode 27.

The protruding member 80 is disposed in the cavity 28. The protruding member 80 is supported by a bottom surface 28A of the cavity 28. The protruding member 80 protrudes from the bottom surface 28A of the cavity 28 toward a flexible board 30. In the second embodiment, the protruding member 80 is in contact with a top surface 28C of the cavity 28, that is, the other main surface 30B of the flexible board

30. Note that the protruding member 80 may be separated from the top surface 28C of the cavity 28.

As illustrated in FIG. 6, the wall 81 extends along the lateral direction of a rigid board 20. The pillars 82 and 83 each have a cylindrical shape. The wall 81 and the pillars 82 and 83 are not limited to the shapes illustrated in FIG. 6. For example, the wall 81 may extend along the longitudinal direction of the rigid board 20 or may be bent or curved. Furthermore, for example, the pillars 82 and 83 each may have a shape other than a cylindrical shape such as a quadrangular prism shape or a truncated cone shape.

When viewed in a thickness direction TD of the rigid board 20, the wall 81 is located at the central portion of the cavity 28. On the other hand, when viewed in the thickness direction TD of the rigid board 20, the pillars 82 and 83 are at positions shifted from the central portion of the cavity 28.

In the second embodiment, the wall 81 is located at the central portion of the cavity 28 in the longitudinal direction of the bottom surface 28A. On the other hand, the wall 81 extends from the central portion of the cavity 28 to a position near the side surface 28B in the lateral direction of the bottom surface 28A. Even in this case, since the wall 81 is positioned at the central portion of the cavity 28 in the longitudinal direction of the bottom surface 28A, the wall is positioned at the central portion of the cavity 28 as viewed in the thickness direction TD of the rigid board 20. That is, in the second embodiment, that the wall 81 is positioned at the central portion of the cavity 28 means that the wall 81 is positioned at the central portion of the cavity 28 in at least one of the longitudinal direction and the lateral direction of the bottom surface 28A.

For example, when the wall 81 extends along the lateral direction of the rigid board 20 as in the configuration illustrated in FIG. 6, the wall 81 is positioned at the central portion of the cavity 28 in the longitudinal direction of the rigid board 20, and the pillars 82 and 83 are positioned on the left side or the right side of the drawing of FIG. 6 with respect to the wall 81 (a position shifted from the central portion of the cavity 28). Referring to FIG. 6, the pillars 82 and 83 are located on the left side of the drawing of FIG. 6 with respect to the wall 81. In addition, for example, when the wall 81 extends along the longitudinal direction of the rigid board 20, the wall 81 is positioned at the central portion of the cavity 28 in the lateral direction of the rigid board 20, and the pillars 82 and 83 are positioned on the upper side or the lower side of the drawing of FIG. 6 with respect to the wall 81 (a position shifted from the central portion of the cavity 28).

In contrast to this, in the first embodiment, the pillar 82 is located closer to one of the pair of facing side surfaces 28B in the longitudinal direction of the bottom surface 28A and is also located closer to one of the pair of the facing side surfaces 28B in the lateral direction of the bottom surface 28A. In this case, the pillar 82 is not positioned at the central portion of the cavity 28 as viewed in the thickness direction TD of the rigid board 20. Similarly, the pillar 83 is located closer to one of the pair of facing side surfaces 28B in the longitudinal direction of the bottom surface 28A and is also located closer to the other of the pair of the facing side surfaces 28B in the lateral direction of the bottom surface 28A. In this case, the pillar 83 is not positioned at the central portion of the cavity 28 as viewed in the thickness direction TD of the rigid board 20.

As illustrated in FIG. 5, the wall 81 overlaps an electrode 37 of the flexible board 30 as viewed in the thickness direction TD of the rigid board 20. In the second embodiment, as viewed in the thickness direction TD of the rigid board 20, the wall 81 overlaps an electrode 37A formed on an inner surface 30C of the flexible board 30 and an electrode 37B formed on one main surface 30A of the flexible board 30. In the second embodiment, a part of the wall 81 overlaps a part of the electrode 37A and a part of the electrode 37B when viewed from the thickness direction TD of the rigid board 20. On the other hand, in the second embodiment, as viewed in the thickness direction TD of the rigid board 20, the pillars 82 and 83 are at positions shifted from the electrodes 37A. Specifically, the pillar 82 is located on the back side of the drawing of FIG. 5 with respect to the electrode 37, and the pillar 83 is located on the front side of the drawing of FIG. 5 with respect to the electrode 37.

The overlap between the protruding member 80 and the electrode 37 when viewed from the thickness direction TD of the rigid board 20 is not limited thereto. For example, when viewed from the thickness direction TD of the rigid board 20, the entire wall 81 may overlap a part of the electrode 37, a part of the wall 81 may overlap the entire electrode 37, or the entire wall 81 may overlap the entire electrode 37. Further, for example, at least a part of the pillars 82 and 83, in addition to the wall 81, may also overlap at least a part of the electrode 37 when viewed from the thickness direction TD of the rigid board 20. That is, at least a part of the protruding member 80 may overlap at least a part of the electrode 37 as viewed in the thickness direction TD of the rigid board 20.

According to the second embodiment, since the protruding member 80 comes into contact with the flexible board 30 from the bottom surface 28A side of the cavity 28, the deflection of the flexible board 30 can be suppressed. As a result, the volume variation of the cavity 28 can be suppressed.

According to the second embodiment, the protruding member 80 is in contact with the top surface 28C of the cavity 28. As a result, the deflection of the flexible board can be suppressed as compared with the configuration in which the protruding member is separated from the top surface 28C of the cavity 28.

According to the second embodiment, the protruding member 80 is made of the same material as the boards 21 to 25 or the electrode 27. Accordingly, when the protruding member 80 and the bottom surface 28A of the cavity 28 are bonded to each other, using the same material can enhance the adhesiveness. In addition, since the types of materials to be used can be reduced, it is possible to suppress an increase in the cost of the wiring board due to the use of members of various types of materials.

According to the second embodiment, the protruding member 80 is located at the central portion of the cavity 28 as viewed in the thickness direction TD of the rigid board 20. This makes it possible to suppress the deflection of the flexible board 30 as compared with the configuration in which the protruding member 80 is positioned near the outer edge portion of the cavity 28 as viewed in the thickness direction TD of the rigid board 20.

According to the second embodiment, the protruding member 80 overlaps the electrode 37 as viewed in the thickness direction TD of the rigid board 20. This makes it possible to suppress the deflection of the flexible board 30 as compared with the configuration in which the protruding member 80 is at a position shifted from the electrode 37 as viewed in the thickness direction TD of the rigid board 20.

Figure 7:
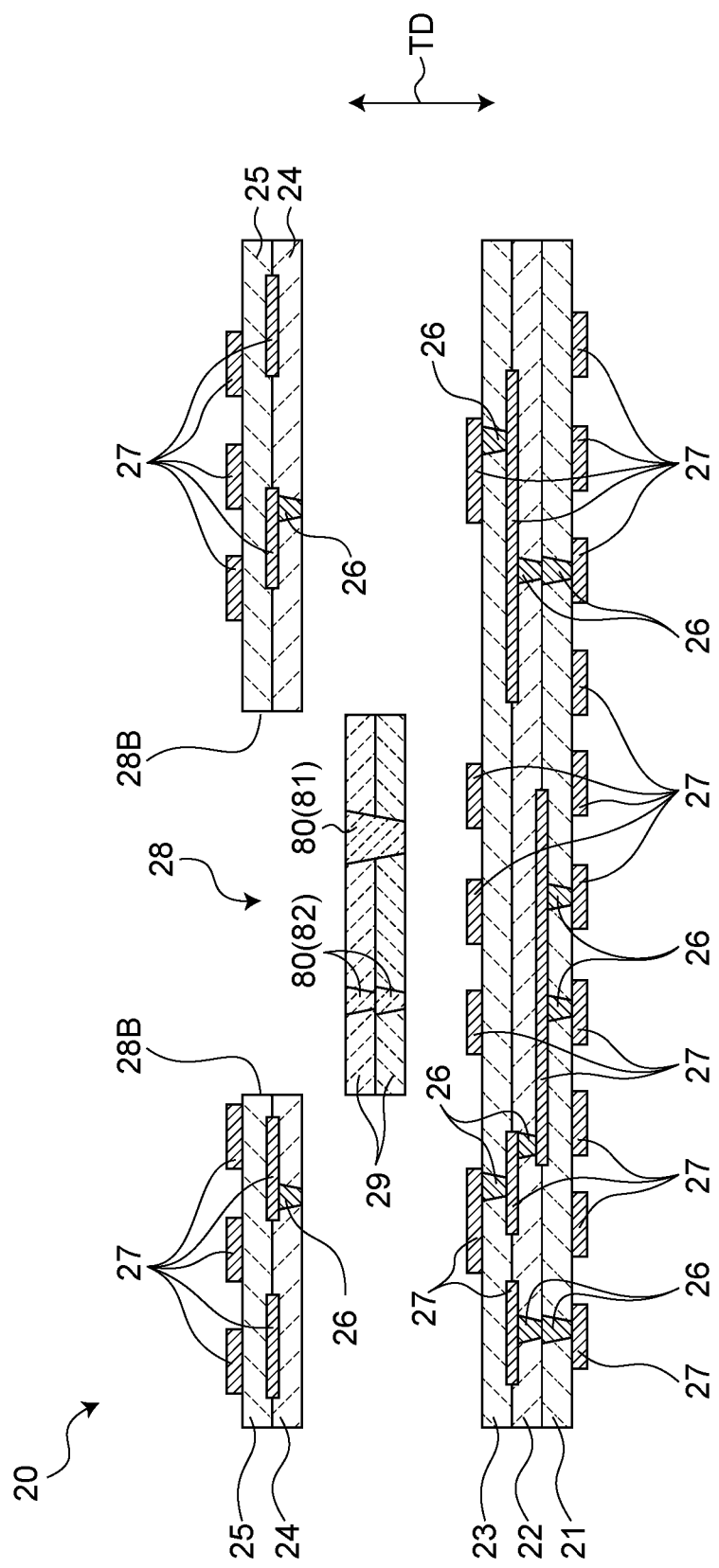
FIG. 7 is a longitudinal sectional view corresponding to the A-A cross section of the rigid board of a wiring board provided with a module according to the second embodiment of the present disclosure in FIG. 1.

Hereinafter, an example of a method for manufacturing the wiring board 10A according to the second embodiment will be described. Hereinafter, only processes different from the method for manufacturing the wiring board 10 according to the first embodiment will be described. FIG. 7 is a longitudinal sectional view corresponding to the A-A cross section of the rigid board of a wiring board provided with a module according to the second embodiment of the present disclosure in FIG. 1.

As shown in FIG. 7, in the rigid board preparing step, a forming sheet 29 for forming the protruding member 80 is prepared separately from a green sheet. The forming sheet 29 has a shape and a size corresponding to the cavity 28 formed in the boards 24 and 25. A plurality of forming sheets 29 are laminated according to the length of the cavity 28 in the thickness direction TD. Referring to FIG. 7, two forming sheets 29 are laminated. For the forming sheet 29, for example, non-sinterable ceramic powder, a resin that burns out during firing, or the like is used.

A through hole is formed in the forming sheet 29, and the through hole is filled with ceramic, a conductive material, or the like. The filled material corresponds to the protruding member 80 (the wall 81 and the pillars 82 and 83). The width of the wall 81 is, for example, 50 μm to 200 μm. The diameter of the pillars 82 and 83 is, for example, 50 μm to 200 μm.

The forming sheet 29 is disposed in the cavity 28. Thereafter, the forming sheet 29 is fired together with the green sheet. As a result, while the green sheet is sintered, the forming sheet 29 is burned out. In the case of the non-sinterable ceramic, the non-sinterable ceramic can be removed by cleaning after firing. As a result, the ceramic, the conductive material, or the like in the cavity 28 is formed as the protruding member 80.

In the second embodiment, the wiring board 10A includes the three protruding member 80 (the one wall 81 and the two pillars 82 and 83). However, the number of protruding members 80 is not limited to three. For example, the wiring board 10A may include only one wall 81 as the protruding member 80.

In the second embodiment, as viewed in the thickness direction TD of the rigid board 20, the wall 81 is positioned at the central portion of the cavity 28, while the pillars 82 and 83 are positioned away from the central portion of the cavity 28. That is, as viewed in the thickness direction TD of the rigid board 20, some of the plurality of protruding members 80 are located at the central portion of the cavity 28. However, when viewed in the thickness direction TD of the rigid board 20, all the protruding members 80 may be located at the central portion of the cavity 28 or all the protruding members 80 may be located at positions shifted from the central portion of the cavity 28.

As indicated by the broken line in FIG. 5, the electrode 37 may be formed on the top surface 28C of the cavity 28 in the other main surface 30B of the flexible board 30. The electrode 37 may occupy the entire top surface 28C or only a part of the top surface 28C. The electrode 37 formed on the top surface 28C may be in contact with the protruding member 80. Referring to FIG. 5, electrode 37 formed on the top surface 28C is in contact with wall 81. When the wall 81 is made of the same material as the electrode 27, the electrode 37 is electrically connected to the wall 81.

Note that the electrode 37 formed on the top surface 28C of the cavity 28 may not be electrically connected to other electronic components 40 and the like. In other words, the electrode 37 may be disposed as a dummy. From the viewpoint of preventing the formation of a stray capacitance, it is preferable that the electrode 37 is not connected to the ground.

In general, the rigidity of the electrode 37 formed on the flexible board 30 is higher than the rigidity of the boards 31 and 32 of the flexible board 30. According to the configuration in which the electrode 37 is located at the position indicated by the broken line in FIG. 5, the electrode 37 having higher rigidity than the boards 31 and 32 comes into contact with the protruding member 80, so that the deflection of the flexible board 30 can be suppressed as compared with the configuration in which the boards 31 and 32 come into contact with the protruding member 80.

In the second embodiment, at least a part of the protruding member 80 overlaps at least a part of the electrode 37 as viewed in the thickness direction TD of the rigid board 20. However, as viewed in the thickness direction TD of the rigid board 20, the protruding member 80 may be at a position shifted from the electrode 37. For example, as indicated by the broken line in FIG. 5, the wiring board 10A may include a protruding member 80A at a position shifted from the electrode 37 as viewed in the thickness direction TD of the rigid board 20.

The protruding member 80A at the position indicated by the broken line in FIG. 5 is at a position shifted from the electrode 37 as viewed in the thickness direction TD of the rigid board 20. In this case, the configuration in which the protruding member 80 overlaps the electrode 37 as viewed in the thickness direction TD of the rigid board 20 can suppress capacitive coupling between the circuit formed on the rigid board 20 and the circuit formed on the flexible board 30.

Third Embodiment

Figure 8:
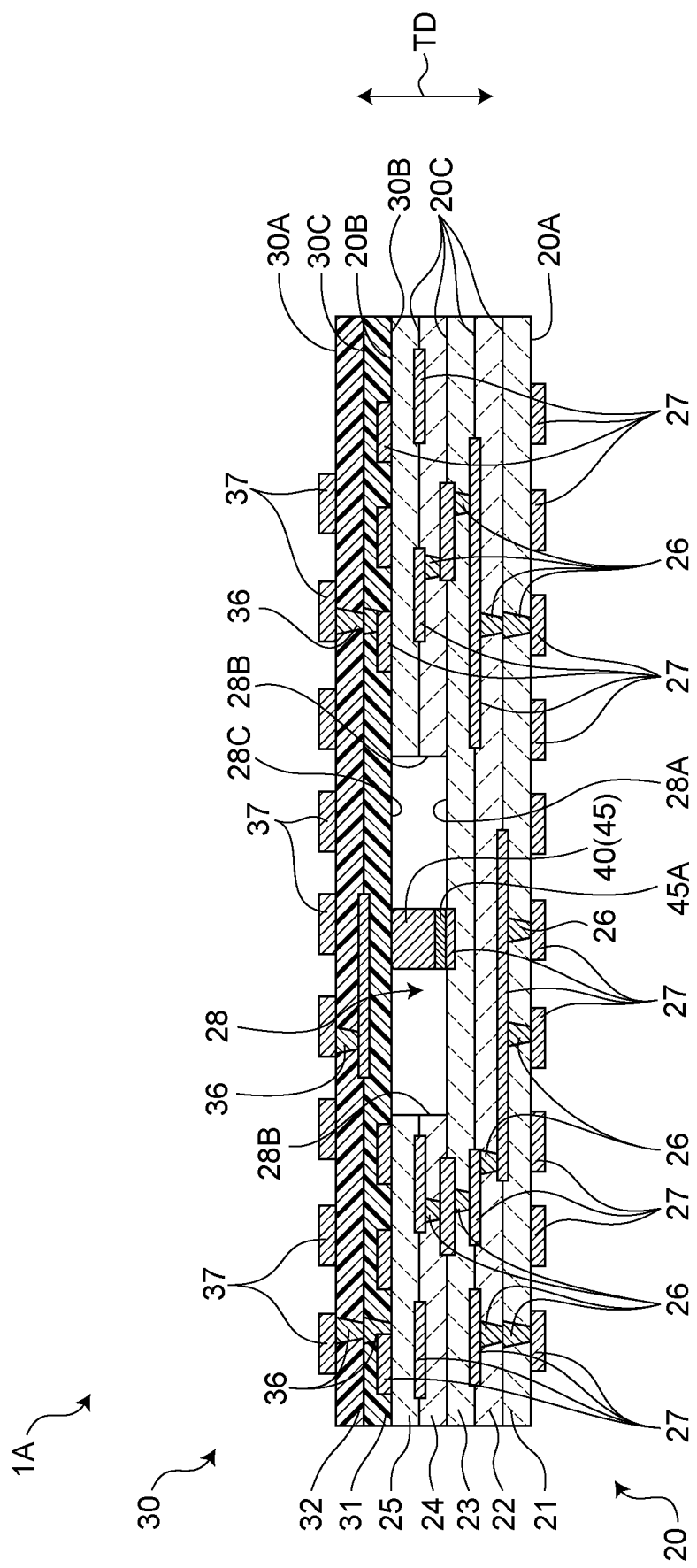
FIG. 8 is a longitudinal sectional view corresponding to the A-A cross section of a module according to a third embodiment of the present disclosure in FIG. 1.

FIG. 8 is a longitudinal sectional view corresponding to the A-A cross section of a module according to a third embodiment of the present disclosure in FIG. 1. A module 1A according to the third embodiment is different from the module 1 according to the first embodiment in that an electronic component 40 is provided in a cavity 28. Hereinafter, differences from the first embodiment will be described.

As illustrated in FIG. 8, the module 1A includes an electronic component 45 as the electronic component 40 in addition to electronic components 41 to 44. The electronic component 45 includes a conductive member 45A having the same configuration as conductive members 41A and 42A. The electronic component 45 is electrically connected to the electrode 27 formed on a bottom surface 28A of the cavity 28 via the conductive member 45A. As a result, the electronic component 45 is mounted on the bottom surface 28A of the cavity 28. In the third embodiment, the electronic component corresponds to a protruding member. Therefore, for example, the electronic component 45 may be in contact with a top surface 28C of the cavity 28 (see FIG. 8) or may be away from the top surface 28C.

The electronic component 45 is, for example, a capacitor, an inductor, a resistor, or an LC filter. The electronic component 45 may not be electrically connected to other electronic components 40 and the like. In other words, the electronic component 45 may be disposed as a dummy. Obviously, the electronic component 45 may be electrically connected to other electronic components 40 and the like.

In the third embodiment, the electronic component 45 is mounted before a flexible board lamination process.

According to the third embodiment, the electronic component 45 functions similarly to the protruding member 80 in the second embodiment. In other words, the protruding member can have the function of the electronic component 40 in addition to the function of suppressing the deflection of the flexible board 30. This makes it possible to reduce the number of electronic components 40 mounted on the outer surfaces (one main surfaces 20A and 30A) of the rigid board 20 and the flexible board 30.

Fourth Embodiment

Figure 9:
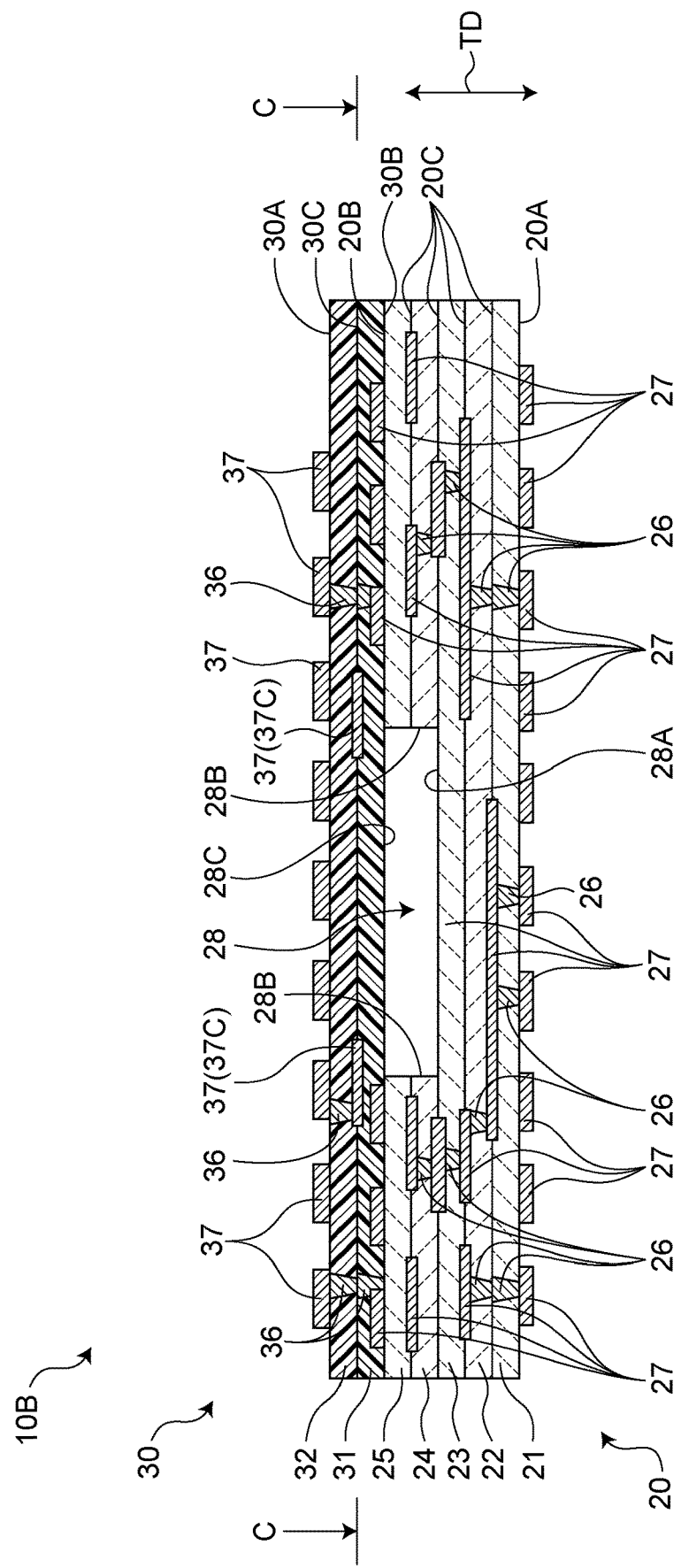
FIG. 9 is a longitudinal sectional view corresponding to the A-A cross section of a wiring board provided with a module according to a fourth embodiment of the present disclosure in FIG. 1.
Figure 10:
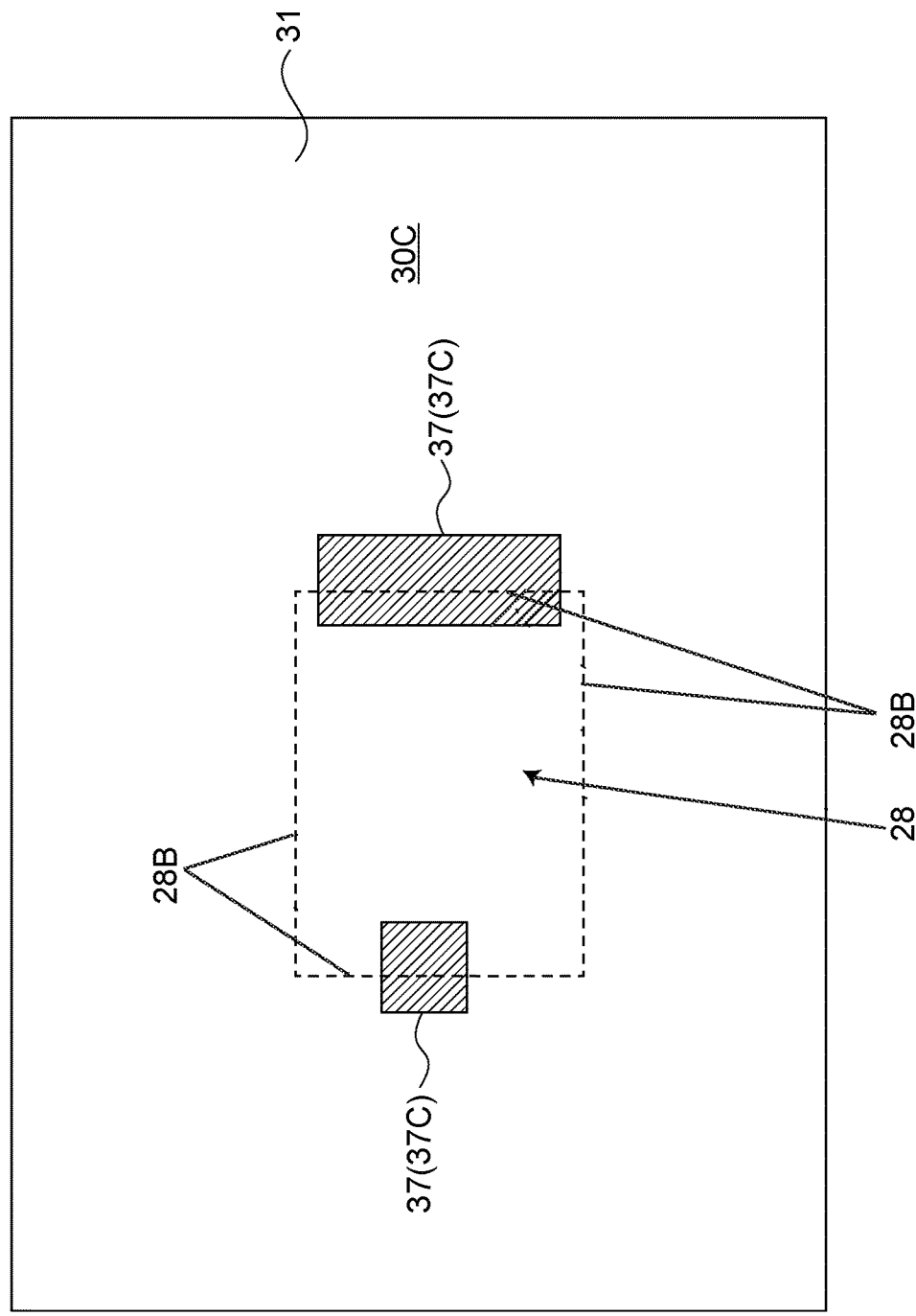
FIG. 10 is a transverse sectional view showing the C-C cross section in FIG. 9.

FIG. 9 is a longitudinal sectional view corresponding to the A-A cross section of a wiring board provided with a module according to the fourth embodiment of the present disclosure in FIG. 1. FIG. 10 is a transverse sectional view showing the C-C cross section in FIG. 9. A wiring board 10B according to the fourth embodiment is different from the wiring board 10 according to the first embodiment in that an electrode 37 included in the wiring board 10B straddles the outer edge portion of a cavity 28 when viewed from a thickness direction TD of a rigid board 20. Hereinafter, differences from the first embodiment will be described.

As illustrated in FIGS. 9 and 10, the electrode 37 included in a flexible board 30 of the wiring board 10B includes an electrode 37C. The electrode 37C is formed on an inner surface 30C of the flexible board 30. The electrode 37C is formed so as to straddle the outer edge portion of the cavity 28 when viewed from the thickness direction TD of the rigid board 20. The outer edge portion of the cavity 28 includes a side surface 28B of the cavity 28 and a nearby portion of the side surface 28B.

In the fourth embodiment, as illustrated in FIG. 10, the electrode 37C is formed so as to straddle the side surfaces 28B constituting two sides facing each other among the side surfaces 28B constituting the four sides of the cavity 28 having a rectangular shape when viewed from the thickness direction TD of the rigid board 20. That is, as viewed in the thickness direction TD of the rigid board 20, the electrode 37C straddles a part of the outer edge portion of the cavity 28.

FIG. 11 is a transverse sectional view corresponding to the C-C cross section of a modification of a wiring board provided with a module according to the fourth embodiment of the present disclosure in FIG. 9. As illustrated in FIG. 11, when viewed in the thickness direction TD of the rigid board 20, the electrode 37C may straddle the entire circumference of the outer edge portion of the cavity 28. That is, as viewed in the thickness direction TD of the rigid board 20, the electrode 37C straddles at least a part of the outer edge portion of the cavity 28.

The electrode 37C may not be electrically connected to other electronic components 40 and the like. In other words, the electrode 37C may be disposed as a dummy. From the viewpoint of preventing the formation of stray capacitance, the electrode 37C is preferably not connected to the ground.

According to the fourth embodiment, the deflection of the flexible board 30 can be suppressed as compared with the configuration in which the electrode 37 does not straddle the outer edge portion of the cavity 28.

FIG. 12 is a longitudinal sectional view corresponding to the A-A cross section of a modification of the wiring board provided with the module according to the fourth embodiment of the present disclosure in FIG. 1. The electrode 37C straddling the outer edge portion of the cavity 28 may be formed on a surface other than the inner surface 30C of the flexible board 30. For example, as illustrated in FIG. 12, the electrode 37C may be formed on the other main surface 30B of the flexible board 30. That is, the electrode 37C straddling the outer edge portion of the cavity 28 may be formed on the surface of the board 31 which is located on the rigid board 20 side.

When the electrode 27 is formed on the other main surface 20B of the rigid board a step is generated between a portion of the other main surface 20B on which the electrode 27 is formed and a portion of the other main surface 20B on which the electrode 27 is not formed. When the flexible board 30 is laminated on the rigid board 20, the flexible board 30 may be deflected due to the generation of the above-described step at the outer edge portion of the cavity 28. According to the fourth embodiment, the electrode 37C straddling the outer edge portion of the cavity 28 is formed on the other main surface of the flexible board. As a result, the step at the outer edge of the cavity 28 can be reduced. This makes it possible to suppress the deflection of the flexible board 30 as described above.

Note that, by appropriately combining arbitrary embodiments among the various embodiments described above, the effects of the respective embodiments can be achieved.

Although the present disclosure has been fully described in connection with the preferred embodiments with reference to the drawings as appropriate, various changes and modifications will be apparent to those skilled in the art. Such variations and modifications should be understood to be included within the scope of the present disclosure according to the appended claims as long as they do not depart therefrom.

1 module
10 wiring board
20 rigid board
21 board (first base material)
22 board (first base material)
23 board (first base material)
24 board (first base material)
25 board (first base material)
27 electrode (first electrode)
28 cavity
30 flexible board
31 board (second base material)
32 board (second base material)
37 electrode (second electrode)
41 electronic component (first transmission/reception component)
42 electronic component (second transmission/reception component)
45 electronic component (protruding member)
80 protruding member
81 wall (protruding member)
82 pillar (protruding member)
83 pillar (protruding member)

What is claimed is:

1. A wiring board comprising:
a rigid board; and
a flexible board laminated on the rigid board, wherein
a cavity recessed in a thickness direction of the rigid board is provided in a surface of the rigid board facing the flexible board, wherein
a side surface and a bottom surface of the cavity are comprised of the rigid board, and wherein
a top surface of the cavity is comprised of the flexible board.

2. The wiring board of claim 1, further comprising:
a protruding member disposed in the cavity and protruding from the bottom surface of the cavity toward the flexible board.

3. The wiring board of claim 2, wherein
the rigid board comprises a first base material and a first electrode provided on the first base material, and wherein
the protruding member comprises a same material as the first base material or the first electrode.

4. The wiring board of claim 3, wherein
the protruding member is in contact with the top surface of the cavity.

5. The wiring board of claim 3, wherein
the protruding member is located in a central portion of the cavity as viewed in the thickness direction of the rigid board.

6. The wiring board of claim 2, wherein
the protruding member is in contact with the top surface of the cavity.

7. The wiring board of claim 6, wherein
the flexible board comprises a second base material and a second electrode provided on the second base material, wherein
the second electrode forms at least a part of the top surface of the cavity and wherein
the protruding member is in contact with the second electrode forming the top surface of the cavity.

8. The wiring board of claim 7, wherein
the protruding member is located in a central portion of the cavity as viewed in the thickness direction of the rigid board.

9. The wiring board of claim 6, wherein
the protruding member is located in a central portion of the cavity as viewed in the thickness direction of the rigid board.

10. The wiring board of claim 2, wherein
the protruding member is located in a central portion of the cavity as viewed in the thickness direction of the rigid board.

11. The wiring board of claim 2, wherein
the flexible board comprises a second base material and a second electrode provided on the second base material, and wherein
at least a part of the protruding member overlaps at least a part of the second electrode when viewed from the thickness direction of the rigid board.

12. The wiring board of claim 2, wherein
the flexible board comprises a second base material and a second electrode provided on the second base material, and wherein
the protruding member is at a position shifted from the second electrode when viewed from the thickness direction of the rigid board.

13. A module comprising:
the wiring board of claim 2; and
an electronic board mounted on the rigid board, wherein
the protruding member is the electronic component.

14. The wiring board of claim 1, wherein
the flexible board comprises a second base material and a second electrode provided on the second base material, and wherein
the second electrode straddles at least a part of an outer edge portion of the cavity when viewed from the thickness direction of the rigid board.

15. The wiring board of claim 14, wherein
the second electrode straddling the outer edge portion of the cavity is provided on a surface of the second base material facing the rigid board.

16. The wiring board of claim 1, wherein
the rigid board comprises a first base material and a first electrode provided on the first base material, and wherein
the flexible board comprises a second base material and a second electrode provided on the second base material, and wherein
a first Young's modulus of the first base material is 10 times or more a second Young's modulus of the second base material.

17. The wiring board of claim 1, wherein
the flexible board completely closes the cavity.

18. The wiring board of claim 1, wherein
the flexible board is in direct contact with the rigid board.

19. A module comprising:
the wiring board of claim 1; and
at least one electronic component mounted on at least one of the rigid board and the flexible board and constitutes at least a part of a transmission/reception circuit, wherein
at least a part of the at least one electronic component overlaps at least a part of the cavity when viewed from the thickness direction of the rigid board.

20. The module of claim 19, wherein
the at least one electronic component constituting at least a part of the transmission/reception circuit comprises a first transmission/reception component mounted on the rigid board and a second transmission/reception component mounted on the flexible board, wherein
at least a part of the first transmission/reception component overlaps at least a part of the cavity when viewed from the thickness direction of the rigid board, and wherein
at least a part of the second transmission/reception component overlaps at least a part of the cavity when viewed from the thickness direction of the rigid board.

* * * * *